United States Patent
Ikabata

(10) Patent No.: US 6,285,616 B1
(45) Date of Patent: Sep. 4, 2001

(54) MEMORY REFRESHING CONTROL APPARATUS COMPRISING A UNIQUE REFRESHING COUNTER

(75) Inventor: Osamu Ikabata, Ibaraki (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/516,496

(22) Filed: Mar. 1, 2000

(30) Foreign Application Priority Data

Mar. 2, 1999 (JP) .................................................. 11-054368

(51) Int. Cl.[7] .................................................... G11C 7/00
(52) U.S. Cl. ............... 365/222; 365/230.03; 365/230.05; 365/189.04
(58) Field of Search ............................ 365/222, 230.03, 365/230.05, 189.04

(56) References Cited

U.S. PATENT DOCUMENTS

| | | | | |
|---|---|---|---|---|
| 4,758,993 | * | 7/1988 | Takemae | 365/222 |
| 5,526,128 | * | 6/1996 | Fujiki et al. | 358/444 |
| 5,999,474 | * | 12/1999 | Leung et al. | 365/222 |
| 6,049,502 | * | 4/2000 | Cowles et al. | 365/230.03 |

FOREIGN PATENT DOCUMENTS

| | | |
|---|---|---|
| 61-122994 | 6/1986 | (JP) . |
| 3-124399 | 12/1991 | (JP) . |
| 5-109269 | 4/1993 | (JP) . |
| 5-347093 | 12/1993 | (JP) . |
| 6-28850 | 2/1994 | (JP) . |
| 6-68671 | 3/1994 | (JP) . |
| 7-141862 | 6/1995 | (JP) . |
| 10-134569 | 5/1998 | (JP) . |
| 10-222979 | 8/1998 | (JP) . |

* cited by examiner

Primary Examiner—David Nelms
Assistant Examiner—Connie C. Yoha
(74) Attorney, Agent, or Firm—Foley & Lardner

(57) ABSTRACT

In a memory refreshing control apparatus for controlling a memory (20) comprising a plurality of bank memories (21, 22, 23, 24) each necessitating refreshing operation, a unique refreshing counter (11) produces a refreshing request while a memory access requesting section (13) produces an access request. A request executing arrangement (12, 14, 15, 16) concurrently executes refreshing processing and access processing for the memory (20) when the refreshing request and the access request are in contention and when the refreshing request and the access request are requests for different bank memories.

11 Claims, 2 Drawing Sheets

US 6,285,616 B1

MEMORY REFRESHING CONTROL APPARATUS COMPRISING A UNIQUE REFRESHING COUNTER

BACKGROUND OF THE INVENTION

This invention relates to a memory refreshing control apparatus and a memory refreshing control method and, more particularly, to a memory refreshing control apparatus and a memory refreshing control method for controlling a memory which comprises a plurality of memory banks each necessitating a refreshing operation.

As is well known in the art, there are various types of memories one of which is a dynamic random access memory such as a DRAM, a synchronous DRAM (SDRAM), and so on. In a case where the dynamic random access memory is used as a data memory, it is necessary to carry out a refreshing operation (a refreshing request) in order to hold data in the memory. An apparatus for controlling such as a refreshing operation (a refreshing request) is a memory refreshing control apparatus.

On controlling the memory necessitating the refreshing operation by the memory refreshing control apparatus, contention for the memory may occur between a normal memory access request for reading and writing the memory and the refreshing operation (the refreshing request). Under the circumstances, a conventional memory refreshing control apparatus always makes either the memory access request or the refreshing request place in a wait state.

On the other hand, the memory where a memory space is divided into a plurality of memory subspaces is known in the art. Each memory subspace is called a bank memory. In addition, the bank memory may be called a memory bank or may be merely called a bank. Various memory refreshing control apparatuses for controlling the memory comprising a plurality of bank memories are known in the art.

By way of example, Japanese Unexamined Utility Model Publication of Jikkai No. H03-124,399 or JP-U H03-124339 discloses a memory control circuit which is capable of avoiding contention between a refreshing and a main memory access and of preventing performance degradation of a computer system. The memory control circuit according to JP-U H03-124339 comprises DRAM control means for controlling banks of a DRAM in one-to-one correspondence and the DRAM control means includes refreshing request means. In addition, the memory control circuit comprises a selector for decoding the memory access from an external to notify the respective banks of select/deselect. A refreshing request occurs when the memory access from the external is decoded and deselect of a bank is notified. In JP-U H03-124339, although the refreshing request and the normal memory access compete in the memory comprising a plurality of banks, the refreshing request and the normal memory access are concurrently processed if the refreshing request and the normal access are made for different banks.

In addition, Japanese Unexamined Patent Publication of Tokkai No. H06-68,671 or JP-A H06-68671 discloses a high-speed memory device without lowering a memory access time due to a wait for a refreshing operation by providing a refreshing controller and a refreshing timer. The memory device disclosed in JP-A H06-68671 comprises a plurality of memory banks having successive memory addresses, a memory controller, the refreshing controller, and refreshing timers for the respective memory banks. Each refreshing timer produces a maximum refreshing period. The memory controller supplies each memory bank with a reading control signal. The refreshing controller refreshes all of the memory banks except for one related to an access request at an earlier one of an access request occurrence time internal from an optional memory bank to the next memory bank and the maximum refreshing period. That is, the memory device disclosed in JP-A H06-68671 continuously monitors a normally accessed bank in the memory banks and simultaneously refreshes the memory bank except for the accessed bank although a normal access is performed at a refreshing timing.

Specifically, when a CPU fetches instruction from a first memory bank, a memory access request is outputted to the memory controller. The memory controller decodes the memory access request and outputs control signal group for reading memory only to the first memory bank. The first memory bank reads data according to the signal group and a memory address. In general, a period for reading program of the CPU is shorter than the refreshing period. When the demand for reading instruction is issued from a second memory bank after reading from the first memory bank, the refreshing of the first, a third, and a fourth memory banks is executed by means of the refreshing controller. Consequently, by successively refreshing all memory banks except for the bank for demanding memory access, the refreshing period is satisfied with the exception of a particular case.

Furthermore, Japanese Unexamined Patent Publication of Tokkai No. H07-141,862 or JP-A H07-141862 discloses a refreshing timing controller which is capable of suppressing contention between refreshing and access for an object to be refreshed by controlling refreshing timing as required. According to JP-A H07-141862, refreshing periods of each bank are measured by counters corresponding to a measuring section. When an access instruction from a CPU of a computer is issued, it is confirmed by a refreshing memory of a control section whether the banks performing access being refreshed or not. And when being refreshed, access is made a standby state until refreshing is finished. When not being refreshed, access is performed, while the banks out of an object of a refreshing period are refreshed first preceding a regular refreshing through the measuring section, effectively refreshed, also, contention between refreshing and access is suppressed for the banks being an object.

In addition, Japanese Unexamined Patent Publication of Tokkai No. H10-134,569 or JP-A H10-134569 discloses a synchronous-type dynamic random access memory which is capable of allowing a memory to effect a refreshing operation selectively and reducing the current consumption by a method wherein a memory cell array divided into multibanks and a circuit selecting the bank to be an object of entry/exit are provided. According to JP-A H10-134569, a self-refreshing bank selection circuit generates a bank selection signal in a self-refreshing mode. In the period of the self-refreshing mode, I/O buffers other than a clock input buffer to which a control signal is inputted are also in enable states to enable to command input continuously. In other words, although the power consumption can not be suppressed in comparison with a conventional synchronous type DRAM, as the refreshing operation is performed by a distributed refreshing method, the total current consumption can be reduced as a cycle time basis.

At any rate, each of JP-A H06-68671, JP-A H07-141862, and JP-A H10-134569 discloses a memory device comprising refreshing timers (refreshing counters) for respective banks.

However, the above-mentioned JP-U H03-124339, JP-A H06-68671, JP-A H07-141862, and JP-A H10-134569 are disadvantageous in that the number of parts (amount of hardware) is increased because of providing with refreshing request arrangements or refreshing timers (refreshing counters) for respective bank memories (memory banks).

In addition, JP-A H10-134569 may disclose a conventional synchronous-type dynamic random access memory comprising only one refreshing counter for all device as a counter for generating a low address signal for self-refreshing. However, the refreshing counter is for making all of the banks execute refreshing operation at once and it is impossible to make an individual bank execute the refreshing operation.

SUMMARY OF THE INVENTION

It is therefore an object of this invention to provide a memory refreshing control apparatus or a memory control method, which are capable of improving memory access performance using little amount of hardware through there is contention between a refreshing request and an access request.

Other objects of this invention will become clear as the description proceeds.

According to a first aspect of this invention, a memory refreshing control apparatus controls a memory comprising a plurality of bank memories each necessitating refreshing operation. The memory refreshing control apparatus comprises a unique refreshing counter for producing a refreshing request for refreshing the memory and a memory access requesting section for producing a memory access request for accessing the memory. Connected to the unique refreshing counter, the memory access requesting section, and the memory, a request executing arrangement concurrently executes a refreshing processing and a memory access processing for the memory when the refreshing request and the memory access request are in contention and when the refreshing request and the memory access request are requests for different bank memories.

In the above-mentioned memory refreshing control apparatus according to the first aspect, the unique refreshing counter periodically may generate a refreshing cycle for all of the bank memories of the memory and the unique refreshing counter may produce the refreshing request on detection of the refreshing cycle.

In addition, the above-mentioned request executing arrangement desirably may comprise a refreshing bank generating section for generating refreshing bank information indicating that the refreshing request is a refreshing request for which bank memory in the memory, an access request bank generating section for generating access bank information indicating that the memory access request is a memory access request for which bank memory in the memory, a bank contention processing section for arbitrating, in response to the refreshing request and the memory access request, contention between the refreshing processing and the memory access processing on the basis of the refreshing bank information and the access bank information to produce an arbitrated result, and a memory control section for controlling the memory on the basis of the arbitrated result.

The above-mentioned bank contention processing section produces, as the arbitrated result, an access execution indication for a particular bank memory indicated by the memory access request when the refreshing request is absent on reception of the memory access request, and the above-mentioned memory control section performs the memory access processing for the particular bank memory designated by the access execution indication. In addition, the above-mentioned bank contention processing section produces, as the arbitrated result, a refreshing execution indication for a specific bank memory indicated by the refreshing request when the memory access request is absent on reception of the refreshing request, and the above-mentioned memory control section performs the refreshing processing for the specific bank memory designated by the refreshing execution indication. In this event, when the refreshing processing is started, the above-mentioned refreshing counter is put into an initial state and subsequently the refreshing counter starts a count of the refreshing cycle for the bank memory which is the next refreshing object.

In addition, the above-mentioned bank contention processing section compares the access bank information with the refreshing bank information to produce a comparison result when the memory access request and the refreshing request are in contention by simultaneously detecting the memory access request and the refreshing request. The above-mentioned bank contention processing section simultaneously produces, as the arbitrated result, a refreshing execution indication for a specific bank memory indicated by the refreshing request and an access execution indication for a particular bank memory indicated by the memory access request when the comparison result indicates that the memory access request and the refreshing request are for different bank memories. The above-mentioned memory control section performs the refreshing processing for the specific bank memory designated by the refreshing execution indication and simultaneously the above-mentioned memory control section performs the memory access processing for the particular bank memory designated by the access execution indication. In this event, when the refreshing processing is started, the refreshing counter is put into an initial state, and subsequently the refreshing counter starts a count of the refreshing cycle for the bank memory which is the next refreshing object.

According to a second aspect of this invention, a memory refreshing control method is for controlling a memory comprising a plurality of bank memories each necessitating refreshing operation. The memory refreshing control method comprises the steps of producing, in a unique refreshing counter, a refreshing request for refreshing the memory, of producing, in a memory access requesting section, a memory access request for accessing the memory, and of concurrently executing a refreshing processing and a memory access processing for the memory when the refreshing request and the memory access request are in contention and when the refreshing request and the memory access request are requests for different bank memories.

According to a third aspect of this invention, a memory refreshing control apparatus controls a memory comprising a plurality of bank memories each necessitating refreshing operation. The memory refreshing control apparatus comprises a unique refreshing counter for producing a refreshing request for refreshing the memory, a memory access requesting section for producing a memory access request for accessing the memory. Connected to the memory, a memory monitoring section monitors access states in the plurality of bank memories to produce monitored information. Connected to the unique refreshing counter, the memory access requesting section, the memory monitoring section, and the memory, a request executing arrangement concurrently executes, with reference to the monitored information, a refreshing processing and a memory access processing for the memory when the refreshing request and the memory access request are in contention and when the refreshing request and the memory access request are requests for different bank memories.

In the above-mentioned memory refreshing control apparatus according to the third embodiment, the above-mentioned unique refreshing counter periodically may generate a refreshing cycle for all of the bank memories of the memory and may produce the refreshing request on detection of the refreshing cycle. In addition, the above-mentioned memory monitoring section desirably may produce, as the monitored information, information indicative of a combination of a state where a bank memory is accessed and a current access timing time interval.

In addition, the above-mentioned request executing arrangement preferably may comprise a refreshing bank generating section for generating refreshing bank information indicating that the refreshing request is a refreshing request for which bank memory in the memory, an access request bank generating section for generating access bank information indicating that the memory access request is a memory access request for which bank memory in the memory, a bank contention processing section for arbitrating, in response to the refreshing request and the memory access request, contention between the refreshing processing and the memory access processing on the basis of the refreshing bank information and the access bank information with reference to the monitored information to produce an arbitrated result, and a memory control section for controlling the memory on the basis of the arbitrated result.

The above-mentioned bank contention processing section produces, as the arbitrated result, an access execution indication for a particular bank memory indicated by the memory access request when the refreshing request is absent on reception of the memory access request, and the above-mentioned memory control section performs the memory access processing for the particular bank memory designated by the access execution indication. In addition, the above-mentioned bank contention processing section produces, as the arbitrated result, a refreshing execution indication for a specific bank memory indicated by the refreshing request when the memory access request is absent on reception of the refreshing request, and the above-mentioned memory control section performs the refreshing processing for the specific bank memory designated by the refreshing execution indication. In this event, when the refreshing processing is started, the above-mentioned refreshing counter is put into an initial state, and subsequently the above-mentioned refreshing counter starts a count of the refreshing cycle for the bank memory which is the next refreshing object.

In addition, the above-mentioned bank contention processing section compares the access bank information with the refreshing bank information to produce a comparison result when the memory access request and the refreshing request are in contention by simultaneously detecting the memory access request and the refreshing request. The above-mentioned bank contention processing section simultaneously produces, as the arbitrated result, a refreshing execution indication for a specific bank memory indicated by the refreshing request and an access execution indication for a particular bank memory indicated by the memory access request when the comparison result indicates that the memory access request and the refreshing request are for different bank memories. The above-mentioned memory control section performs the refreshing processing for the specific bank memory designated by the refreshing execution indication and simultaneously the above-mentioned memory control section performs the memory access processing for the particular bank memory designated by the access execution indication. In this event, when the refreshing processing is started, the above-mentioned refreshing counter is put into an initial state and subsequently starts a count of the refreshing cycle for the bank memory which is the next refreshing object.

In addition, the above-mentioned request execution arrangement preferably may execute the refreshing processing following the memory access processing when the above-mentioned request executing arrangement receives the refreshing request for an accessed bank memory indicated by the monitored information.

According to a fourth aspect of this invention, a memory refreshing control method is for controlling a memory comprising a plurality of bank memories each necessitating refreshing operation. The memory refreshing control method comprises the steps of producing, in a unique refreshing counter, a refreshing request for refreshing the memory, of producing, in a memory access requesting section, a memory access request for accessing the memory, of monitoring access states of the plurality of bank memories to produce monitored information. and of concurrently executing, with reference to the monitored information, a refreshing processing and a memory access processing for the memory when the refreshing request and the memory access request are in contention and when the refreshing request and the memory access request are requests for different bank memories.

DESCRIPTION OF THE PREFERRED EMBODIMENTS

Figure 1:
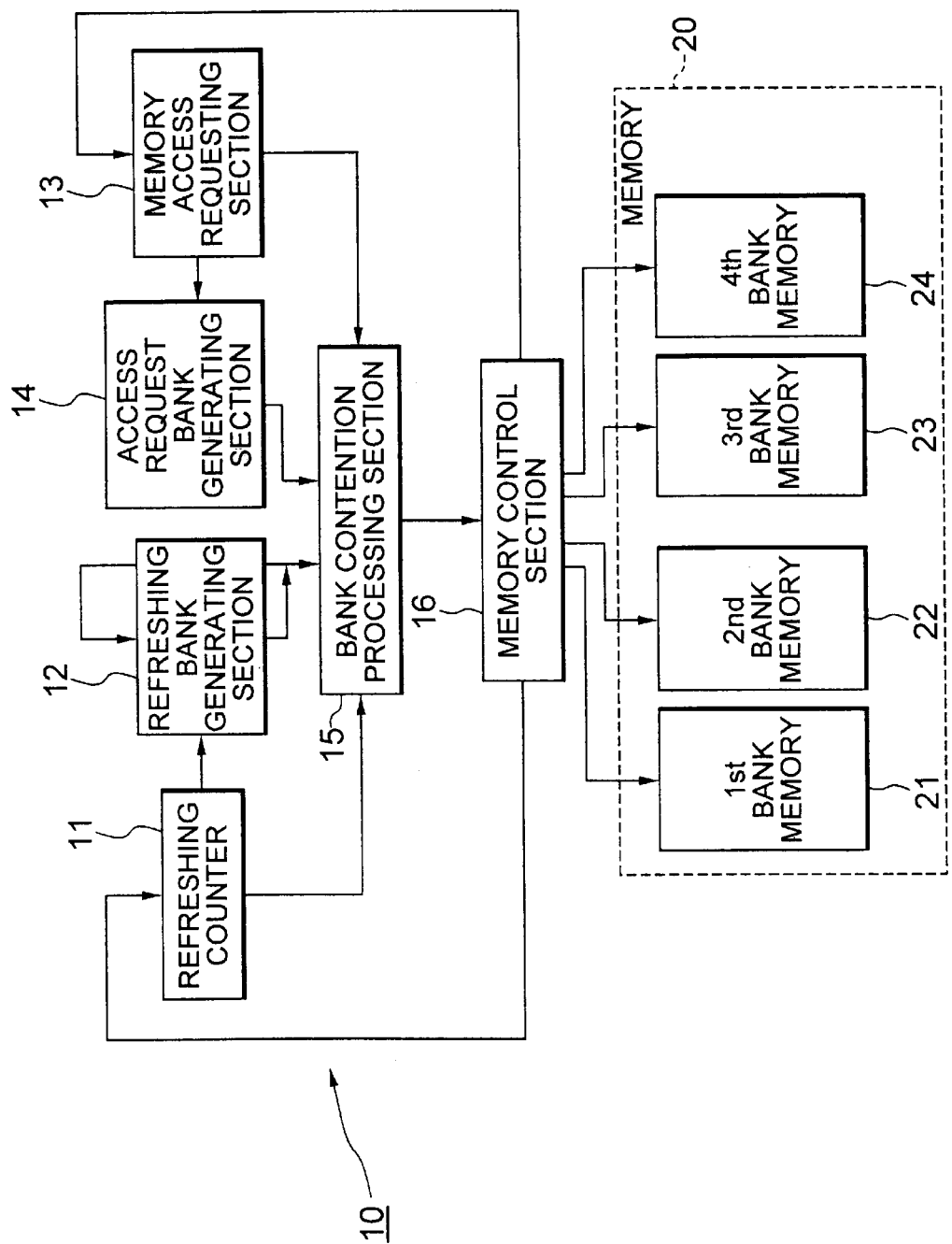
FIG. 1 is a block diagram of a memory and a memory refreshing control apparatus according to a first embodiment of a this invention.

Referring to FIG. 1, the description will proceed to a memory refreshing control apparatus 10 according to a first embodiment of this invention. The illustrated memory refreshing control apparatus 10 is for improving an access performance for a memory 20 by arbitrating contention between a memory access processing and a refreshing processing for bank memories where a memory space is divided into a plurality of memory subspaces.

As illustrated in FIG. 1, the memory 20 comprises a first through fourth memory banks 21, 22, 23, and 24.

The memory refreshing control apparatus 10 comprises a refreshing counter 11, a refreshing bank generating section 12, a memory access requesting section 13, an access request bank generating section 14, a bank contention processing section 15, and a memory control section 16. That is, the memory refreshing control apparatus 10 includes a unique refreshing counter 11.

The unique refreshing counter 11 always generates a refreshing cycle for all of the first through the fourth bank memories 21 to 24 at a predetermined period to produce a refreshing request on detection of the refreshing cycle. The refreshing bank generating section 12 is connected to the unique refreshing counter 11. Responsive to the refreshing request, the refreshing bank generating section 12 successively generates refreshing bank information indicative of a refreshing object. In other words, the refreshing bank information indicates that the refreshing request is a refreshing request for which bank memory in the memory 20.

The memory access requesting section 13 produces a memory access request for reading/writing from/to any bank memory. The access request bank generating section 14 is connected to the memory access requesting section 13. Responsive to the memory access request, the access request bank generating section 14 generates access bank memory information for the memory access request. That is, the access bank memory information indicates that the memory access request is a memory access request for which bank memory in the memory 20.

The bank contention processing section 15 is connected to the refreshing counter 11, the memory access requesting section 13, the refreshing bank generating section 12, and the access request bank generating section 14. Responsive to the refreshing request and the memory access request, the bank contention processing section 15 arbitrates contention between the refreshing processing and the memory access processing on the basis of the refreshing bank information and the access bank information to produce an arbitrated result in the manner which will later become clear. The memory control section 16 is connected to the bank contention processing section 16 and the memory 20. The memory control section 16 controls the memory 20 on the basis of the arbitrated result in the manner which also later become clear.

In FIG. 1, the refreshing counter 11 generates the refreshing cycle for the memory 20. On detection of the refreshing cycle, the refreshing counter 11 supplies the bank contention processing section 15 and the refreshing bank generating section 12 with the refreshing request. The refreshing bank generating section 12 generates the refreshing bank information indicating that the refreshing request generated by the refreshing counter 11 is the refreshing request for which bank memory. When the refreshing request from the refreshing counter 11 is processed by the memory control section 16, the refreshing bank generating section 12 generates the refreshing bank information indicative of the bank memory in which the next refreshing processing is carried out.

The memory access requesting section 13 serves as an arrangement for producing and detecting a processing request for reading or writing for the memory 20. Simultaneously, the memory access requesting section 13 sets the access bank information indicating that which bank memory is accessed in the access request bank generating section 14. On the basis of each processing request from the refreshing counter 11 and the memory access requesting section 13, the bank contention processing section 15 carries out contention between the memory banks and uses a priority decision to determine which processing is to be executed. The memory control section 16 carries out an execution allowed processing request on the first through the fourth bank memories 21 to 24.

It will be assumed that the memory access requesting section 13 produces the memory access request for reading or writing to any bank memory when the refreshing counter 11 produces the refreshing request. In this event, the bank contention processing section 15 determines, on the basis of each bank memory information of the refreshing bank generating section 12 and the access request bank generating section 14, whether or not the refreshing request and the memory access request occur for different bank memories, respectively. When the bank contention processing section 15 determines that the refreshing request and the memory access request occur for the different bank memories, the memory control section 16 concurrently executes the refreshing processing and the memory access processing for the different bank memories.

At any rate, a combination of the refreshing bank generating section 12, the access request bank generating section 14, the bank contention processing section 15, and the memory control section 16 serves as a request executing arrangement for concurrently executing the refreshing processing and the memory access processing for the memory 20 when the refreshing request and the memory access request are in contention and when the refreshing request and the memory access request are made for different bank memories.

Referring now to FIG. 1, the description will proceed to operation of the memory refreshing control apparatus 10 according to the first embodiment of this invention.

It will be presumed that the memory access requesting section 13 produces the memory access request for the memory 20. In this event, the access request bank generating section 14 generates the access bank information indicating that the memory access request is a memory access request for which bank memory in the memory 20. Produced by the memory access requesting section 13, the memory access request is supplied to the bank contention processing section 15 which determines whether or not the refreshing request is produced by the refreshing counter 11.

It will be assumed that the refreshing request is absent in the refreshing counter 11. Under the circumstances, the bank contention processing section 15 permits execution of the memory access request from the memory access requesting section 13 to supply the memory control section 16 with, as the arbitrated result, an access execution indication for the bank memory indicated by the memory access request. Responsive to the access execution indication, the memory control section 16 carries out the memory access processing for the memory bank designated by the access execution indication.

In addition, it will be presumed that the refreshing counter 11 produces the refreshing request for the memory 20. In this event, the refreshing bank generating section 12 generates the refreshing bank information indicative of the refreshing request for which bank memory. Produced by the refreshing counter 11, the refreshing request for the memory 20 is supplied to the bank contention processing section 15 which determines whether or not the memory access requesting section 13 produces the memory access request.

It will be assumed that the memory access request is absent in the memory access requesting section 13. Under the circumstances, the bank contention processing section 15 permits execution of the refreshing request from the refreshing counter 11 to supply the memory control section 16 with, as the arbitrated result, a refreshing execution indication for the bank memory indicated by the refreshing request. Responsive to the refreshing execution indication, the memory control section 16 carries out the refreshing processing for the bank memory designated by the refreshing execution indication.

On the other hand, it will be presumed that the memory access request and the refreshing request are simultaneously detected by the bank contention processing section 15 and are in contention. In this event, the bank contention processing section 15 compares the access bank information indicative of the bank memory for a memory access request object with the refreshing bank information indicative of the bank memory for a refreshing request object. The access bank information is produced by an access requester which comprises the memory access requesting section 13 and the access request bank generating section 14. The refreshing bank information is produced by a refreshing requester which comprises the refreshing counter 11 and the refreshing bank generating section 12.

In the example being illustrated, it will be assumed that the access bank information indicates the first bank memory 21 while the refreshing bank information indicates the third bank memory 23.

When a comparison result indicates that each object of each request is a different memory bank, the bank contention processing section 15 supplies the memory control section 16 with, as the arbitrated result, execution indications for both requests and bank information. The memory control section 16 carries out the refreshing processing for the third bank memory 23 on the basis of the execution indication of the refreshing request and the refreshing bank information and simultaneously the memory control section 16 carries out the memory access processing for the first bank memory 21 on the basis of the access request execution indication and the access bank information.

In this event, when the refreshing processing is started, the refreshing counter 11 is put into an initial state, starts a count of a refreshing cycle for the next bank memory to be refreshed, and successively carries out the count of refreshing cycle for all of the first through the fourth bank memories 21 to 24.

In the manner which is described above, in the above-mentioned first embodiment, it is possible to concurrently execute the refreshing processing and the memory access processing when the refreshing request and the memory access request are in content and are requests for different bank memories. As a result, it is possible to provide a high-performance information processing system because of improvement of performance for a memory access.

In addition, when the refreshing request and the memory access request are in contention and are requests for the same bank memory, the bank contention processing section 15 determines processing to be executed by carrying out a normal priority decision.

Figure 2:
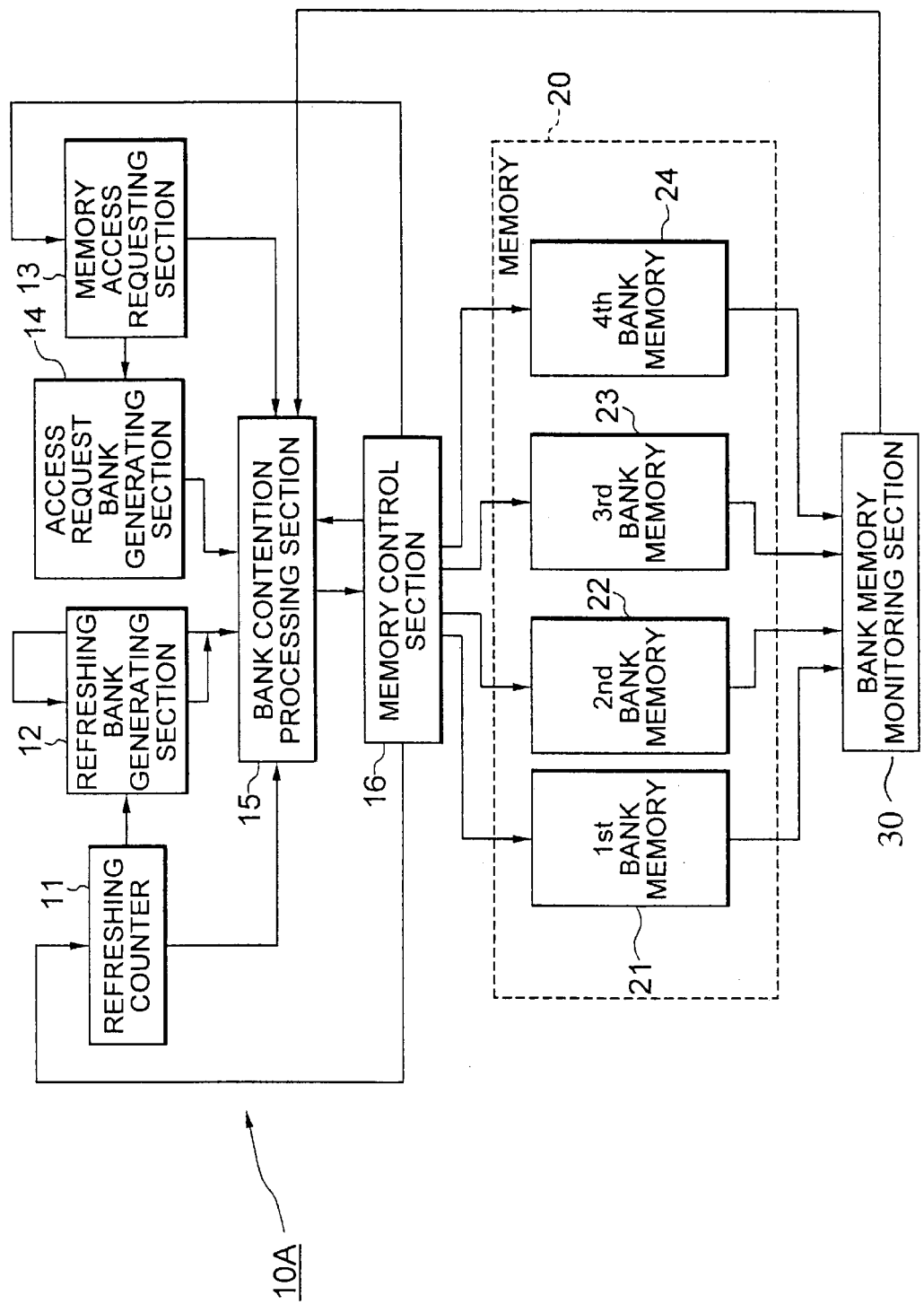
FIG. 2 is a block diagram of a memory and a memory refreshing control apparatus according to a first embodiment of a this invention.

Referring to FIG. 2, the description will proceed to a memory refreshing control apparatus 10A according to a second embodiment of this invention. The illustrated memory refreshing control apparatus 10A is similar in structure and operation to the memory refreshing control apparatus 10 illustrated in FIG. 1 except that the memory refreshing control apparatus 10A further comprises a bank memory monitoring section 30. Therefore, the same reference symbols are attached to those having the similar functions and its description is omitted for the purpose of simplification of description.

The bank memory monitoring section 30 monitors access states in the first through the fourth bank memories 21 to 24. Specifically, the bank memory monitoring section 30 carries out, for each bank memory, monitoring whether or not a bank memory is put into a memory access processed state such as memory reading or memory writing and management of an access timing time interval.

The bank memory monitoring section 30 continuously supplies the bank contention processing section 15 with, as a monitored result, information indicative of a combination of the state where a bank memory is accessed and a current access timing time interval. Accordingly, it is possible for the bank memory monitoring section 30 to continuously monitor the access states in the first through the fourth bank memories 21 to 24.

It will be presumed that the refreshing request is produced by the refreshing counter 11 and the refreshing request is a refreshing request for the bank memory which is already accessed when the bank contention processing section 15 carries out the contention arbitration including the monitored information of the access states that is delivered by the bank memory monitoring section 30. Under the circumstances, without wasting time to access for the bank memory after completion of a current access on the basis of the monitored information from the bank memory monitoring section 30, the bank contention processing section 15 instructs the memory control section 16 so as to carry out the refreshing processing following the memory access processing. As a result, it is possible to immediately carry out the memory access.

In the manner which is described above, the second embodiment is advantageous in that it is possible to perform the refreshing processing following the memory access processing when the refreshing request occurs for the bank memory which is accessed. In addition, the second embodiment is advantageous in that it is possible to successively perform the refreshing processing without the necessity for dead time while the memory access is concentratedly carried out for a particular bank memory.

In addition, differences in structure between this invention and JP-U H03-124339 are as follows. JP-U H03-124339 comprises DRAM in control arrangements for controlling banks of a DRAM in one-to-one correspondence and a refreshing requesting arrangement included in each DRAM control arrangement, while this invention controls the whole of the memory 20 by the memory control section 16 and has no control arrangement (refreshing requesting arrangement) for each bank memory. In addition, JP-U H03-124339 comprises a selector for decoding an external memory access to deliver select/deselect to respective banks while this invention does not have such a selector. Furthermore, JP-U H03-124339 generates the refreshing request when deselect of a bank is delivered by decoding the external memory access while this invention generates the refreshing request regardless of states of the memory banks and carries out contention decision between the refreshing request and the memory access request.

In addition, each of the above-mentioned JP-A H06-68671, JP-A H07-141862, and JP-A H10-134569 comprises a plurality of refreshing counters or timers for respective banks while this invention comprises the unique refreshing counter 11 for measuring a refreshing period for all of the bank memories 21 to 24.

While this invention has thus far been described in conjunction with preferred embodiments thereof, it will now be readily possible for those skilled in the art to put this invention into various other manners. For example, although description is made in the above-mentioned embodiments by way of example in a case where the memory 20 comprises four memory banks 21 to 24, the number of memory banks is not restricted to four and may be equal to two, three, five or more.

What is claimed is:

1. A memory refreshing control apparatus for controlling a memory comprising a plurality of bank memories each necessitating refreshing operation, said memory refreshing control apparatus comprising:

a unique refreshing counter for producing a refreshing request for refreshing said memory;

a memory access requesting section for producing a memory access request for accessing said memory;

a memory monitoring section, connected to said memory, for monitoring access states in said plurality of bank memories to produce monitored information; and request executing means, connected to said unique refreshing counter, said memory access requesting section, said memory monitoring section, and said memory, for concurrently executing, with reference to said monitored information, a refreshing processing and a memory access processing for said memory when said refreshing request and said memory access request are in contention and when said refreshing request and said memory access request are requests for different bank memories.

2. A memory refreshing control apparatus as claimed in claim 1, wherein said unique refreshing counter periodically generates a refreshing cycle for all of said bank memories of said memory, said unique refreshing counter producing said refreshing request on detection of said refreshing cycle.

3. A memory refreshing control apparatus as claimed in claim 1, wherein said memory monitoring section produces, as the monitored information, information indicative of a combination of a state where a bank memory is accessed and a current access timing time interval.

4. A memory refreshing control apparatus as claimed in claim 1, wherein said request executing means comprises:

a refreshing bank generating section, connected to said unique refreshing counter, for generating refreshing bank information indicating that said refreshing request is a refreshing request for which bank memory in said memory;

an access request bank generating section, connected to said memory access requesting section, for generating access bank information indicating that said memory access request is a memory access request for which bank memory in said memory;

a bank contention processing section, connected to said refreshing counter, said memory access requesting section, said refreshing bank generating section, said access request bank generating section, and said memory monitoring section, for arbitrating, in response to said refreshing request and said memory access request, contention between said refreshing processing and said memory access processing on the basis of said refreshing bank information and said access bank information with reference to said monitored information to produce an arbitrated result; and a memory control section, connected to said bank contention processing section and said memory, for controlling said memory on the basis of said arbitrated result.

5. A memory refreshing control apparatus as claimed in claim 4, wherein said bank contention processing section produces, as said arbitrated result, an access execution indication for a particular bank memory indicated by said memory access request when said refreshing request is absent on reception of said memory access request, said memory control section performing said memory access processing for the particular bank memory designated by said access execution indication.

6. A memory refreshing control apparatus as claimed in claim 4, wherein said bank contention processing section produces, as said arbitrated result, a refreshing execution indication for a specific bank memory indicated by said refreshing request when said memory access request is absent on reception of said refreshing request, said memory control section performing said refreshing processing for the specific bank memory designated by said refreshing execution indication.

7. A memory refreshing control apparatus as claimed in claim 6, wherein said refreshing counter is put into an initial state when said refreshing processing is started, subsequently said refreshing counter starting a count of the refreshing cycle for the bank memory which is the next refreshing object.

8. A memory refreshing control apparatus as claimed in claim 4, wherein said bank contention processing section compares said access bank information with said refreshing bank information to produce a comparison result when said memory access request and said refreshing request are in contention by simultaneously detecting said memory access request and said refreshing request, said bank contention processing section simultaneously producing, as said arbitrated result, a refreshing execution indicating for a specific bank memory indicated by said refreshing request and an access execution indication or a particular bank memory indicated by said memory access request when said comparison result indicates that said memory access request and said refreshing request are for different bank memories, said memory control section performing said refreshing processing for the specific bank memory designated by said refreshing execution indication and simultaneously said memory control section performing said memory access processing for the particular bank memory designated by said access execution indication.

9. A memory refreshing control apparatus as claimed in claim 8, wherein said refreshing counter is put into an initial state when said refreshing processing is started, subsequently said refreshing counter starting a count of the refreshing cycle for the bank memory which is the next refreshing object.

10. A memory refreshing control apparatus as claimed in claim 1, wherein said request execution means executes said refreshing processing following said memory access processing when said request executing means receives said refreshing request for an accessed bank memory indicated by said monitored information.

11. A method of controlling a memory comprising a plurality of bank memories each necessitating refreshing operation, said method comprising the steps of;

producing, in a unique refreshing counter, a refreshing request for refreshing said memory;

producing, in a memory access requesting section, a memory access request for accessing said memory;

monitoring access states of said plurality of bank memories to produce monitored information; and concurrently executing, with reference to said monitored information, a refreshing processing and a memory access processing for said memory when said refreshing request and said memory access request are in contention and when said refreshing request and said memory access request are requests for different bank memories.

* * * * *